(12) United States Patent
Ryoo et al.

(10) Patent No.: US 7,831,003 B2
(45) Date of Patent: Nov. 9, 2010

(54) APPARATUS AND METHOD FOR PHASE RECOVERY USING INDEPENDENTLY DECODABLE COMPONENT CODES OF CHANNEL CODE IN WIRELESS COMMUNICATION SYSTEM

(75) Inventors: Sun-heul Ryoo, Daejeon (KR); Do-seob Ahn, Daejeon (KR); Ho-jin Lee, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 652 days.

(21) Appl. No.: 11/722,308

(22) PCT Filed: Nov. 11, 2005

(86) PCT No.: PCT/KR2005/003824

§ 371 (c)(1),
(2), (4) Date: Jun. 20, 2007

(87) PCT Pub. No.: WO2006/068367

PCT Pub. Date: Jun. 29, 2006

(65) Prior Publication Data

US 2009/0274246 A1    Nov. 5, 2009

(30) Foreign Application Priority Data

Dec. 20, 2004 (KR) .................. 10-2004-0108590

(51) Int. Cl.
*H03D 1/00* (2006.01)
(52) U.S. Cl. .................................................. 375/371
(58) Field of Classification Search .................. 375/371
See application file for complete search history.

(56) References Cited

U.S. PATENT DOCUMENTS

| 5,937,016 | A | 8/1999 | Choi |
| 6,317,435 | B1 | 11/2001 | Tiedemann, Jr. et al. |
| 6,377,639 | B1 | 4/2002 | Rzeszewski |
| 6,442,219 | B1 | 8/2002 | Bertrand et al. |
| 6,625,778 | B1 | 9/2003 | Nakamura et al. |
| 6,650,699 | B1 * | 11/2003 | Tierno ........................ 375/232 |

(Continued)

FOREIGN PATENT DOCUMENTS

JP          07-079267 A1      3/1995

(Continued)

OTHER PUBLICATIONS

International Search Report issued on Dec. 29, 2005 in International Application No. PCT/KR2005/003824.

(Continued)

*Primary Examiner*—Kevin Y Kim
(74) *Attorney, Agent, or Firm*—Jae Y. Park; Kile Park Goekjian Reed & McManus PLLC

(57) ABSTRACT

An apparatus and method for phase recovery in a wireless communication system employs independently decodable component codes. The apparatus includes a decoding unit for decoding the input signal to thereby output the decoding value; an estimation unit for estimating phase errors of the received signal by estimating phase errors of the each component codeword in the received signal to thereby generate phase error estimation values; and a correction unit for correcting the phase of received signal using the phase error estimation values to thereby generate the phase corrected signal in an effective manner.

10 Claims, 5 Drawing Sheets

U.S. PATENT DOCUMENTS 6,801,567 B1 10/2004 Schmidl et al.
2002/0067779 A1 6/2002 Jaffe et al.

FOREIGN PATENT DOCUMENTS

| JP | 2001-036416 A | 2/2001 |
| JP | 2004-215310 A | 7/2004 |
| KR | 10-2002-0033372 B1 | 5/2002 |

OTHER PUBLICATIONS

Written Opinion of the International Searching Authority mailed on Dec. 29, 2005 in International Application No. PCT/KR2005/003824.

D'Amico et al., "Efficient Non-Data-Aided Carrier and Clock Recovery for Satellite DVB at Very Low Signal-to-Noise Ratios", IEEE Journal on Selected Areas in Communications, vol. 19, No. 12 (Dec. 2001), pp. 2320-2330.

Lottici et al., "Embedding Carrier Phase Recovery Into Iterative Decoding of Turbo-Coded Linear Modulations", IEEE Transactions on Communications, vol. 52, No. 4 (Apr. 2004), pp. 661-669.

Langlais et al., "Phase carrier recovery for Turbo codes over a satellite link with the help of tentative decisions", 2nd International Symposium on Turbo Codes & Related Topics - Brest - France - 2000, p. 439-442.

Morlet et al., "A Carrier Phase Estimator for Multi-media Satellite Payloads Suited to RSC Coding Schemes", IEEE International Conference on Communications, vol. 1 (Jun. 2000), p. 455-459.

Anastasopoulos et al., "Adaptive Iterative Detection for Phase Tracking in Turbo-Coded Systems", IEEE Transactions on Communications, vol. 49, No. 12 (Dec. 2001), p. 2135-2144.

Colavolpe et al., "Noncoherent Iterative (Turbo) Decoding", IEEE Transactions on Communications, vol. 48, No. 9 (Sep. 2000), pp. 1488-1498.

Nissila et al., "An EM Approach to Carrier Phase Recovery in AWGN Channel", IEEE International Conference on Communications, vol. 7 (Jun. 2001), pp. 2199-2203.

Mielczarek et al., "Phase Offset Estimation using Enhanced Turbo Decoders", IEEE International Conference on Communications, vol. 3 (Apr. 2002), pp. 1536-1539.

\* cited by examiner

[Fig. 1]
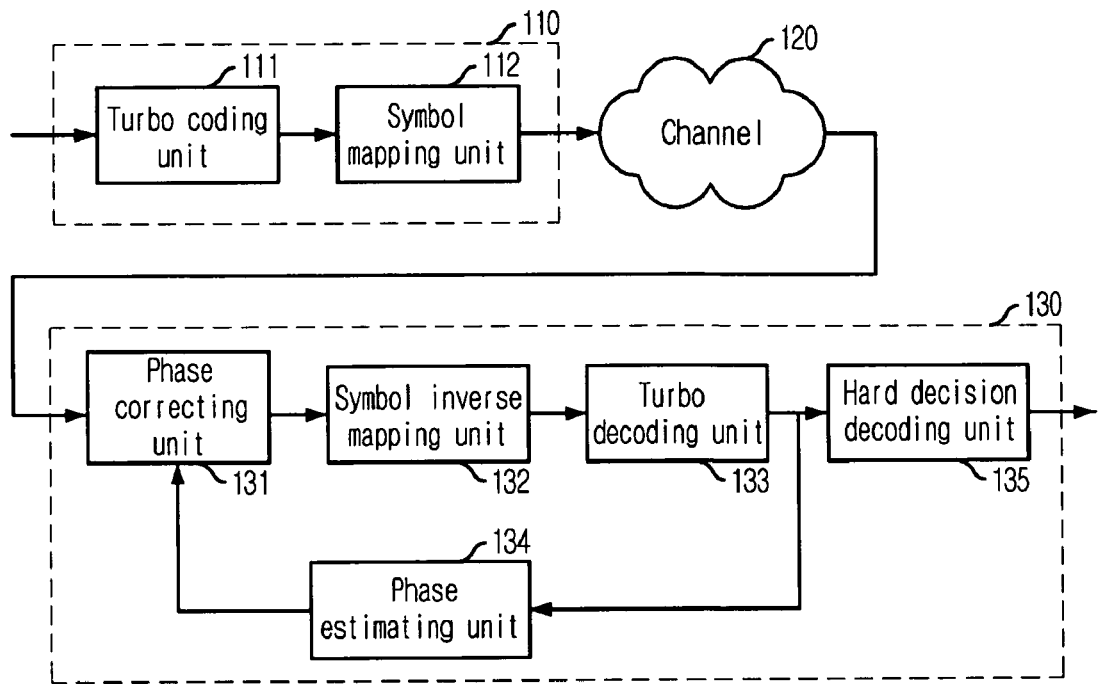
[Fig. 2]
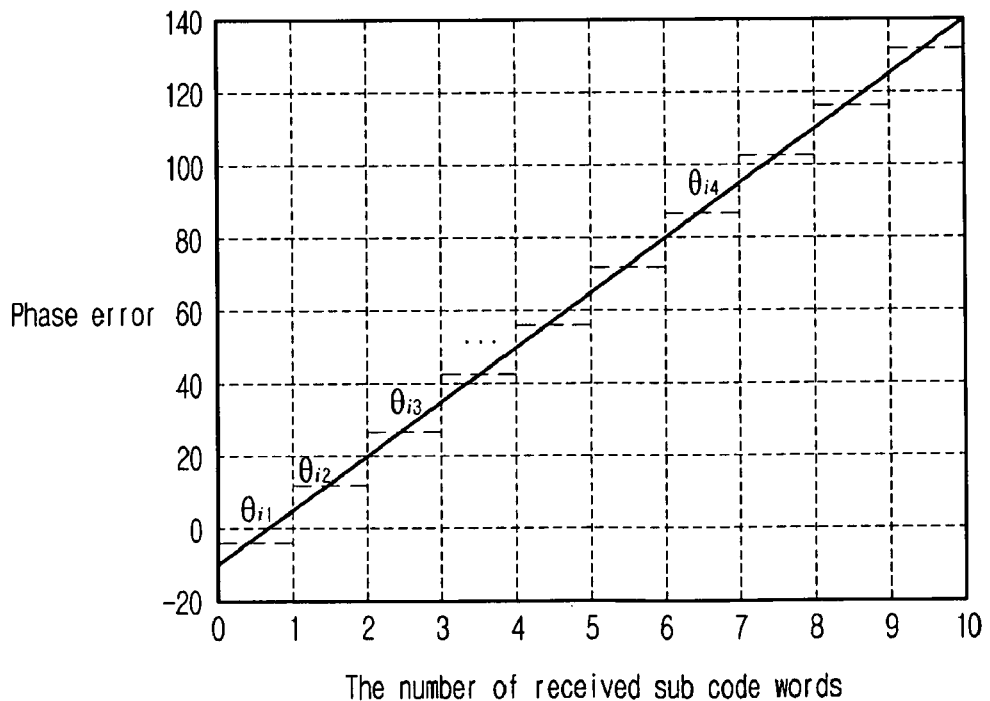

[Fig. 3]
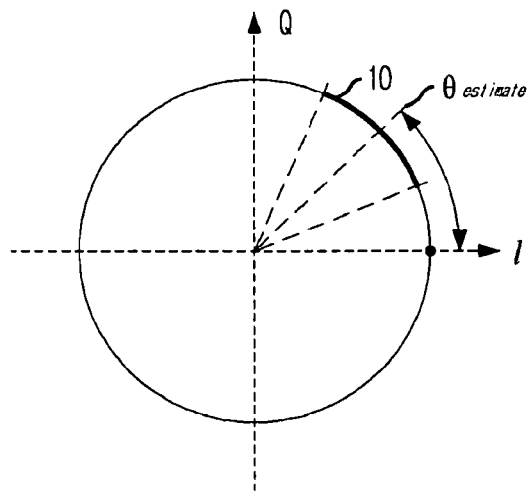
[Fig. 4]
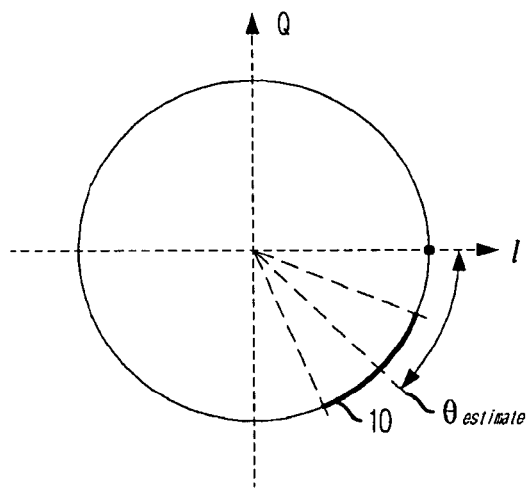
[Fig. 5]
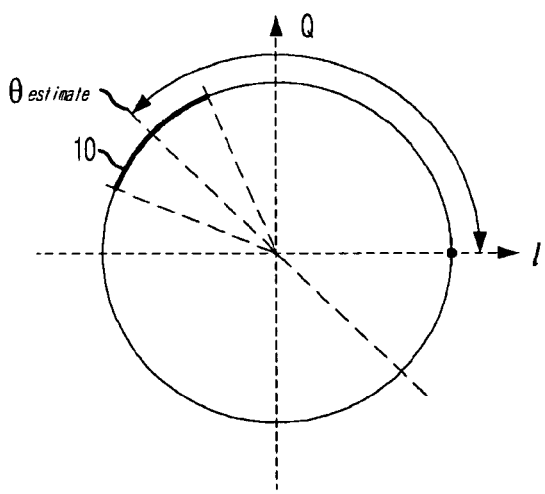

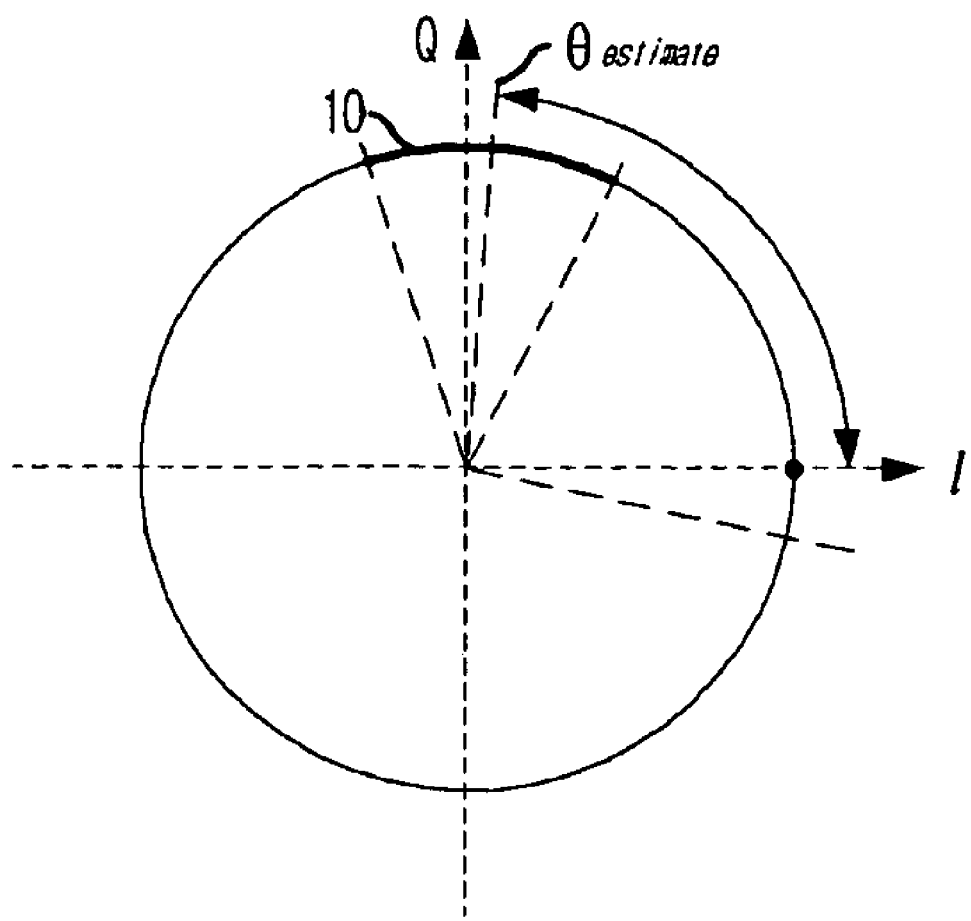
[Fig. 6]

[Fig. 7]
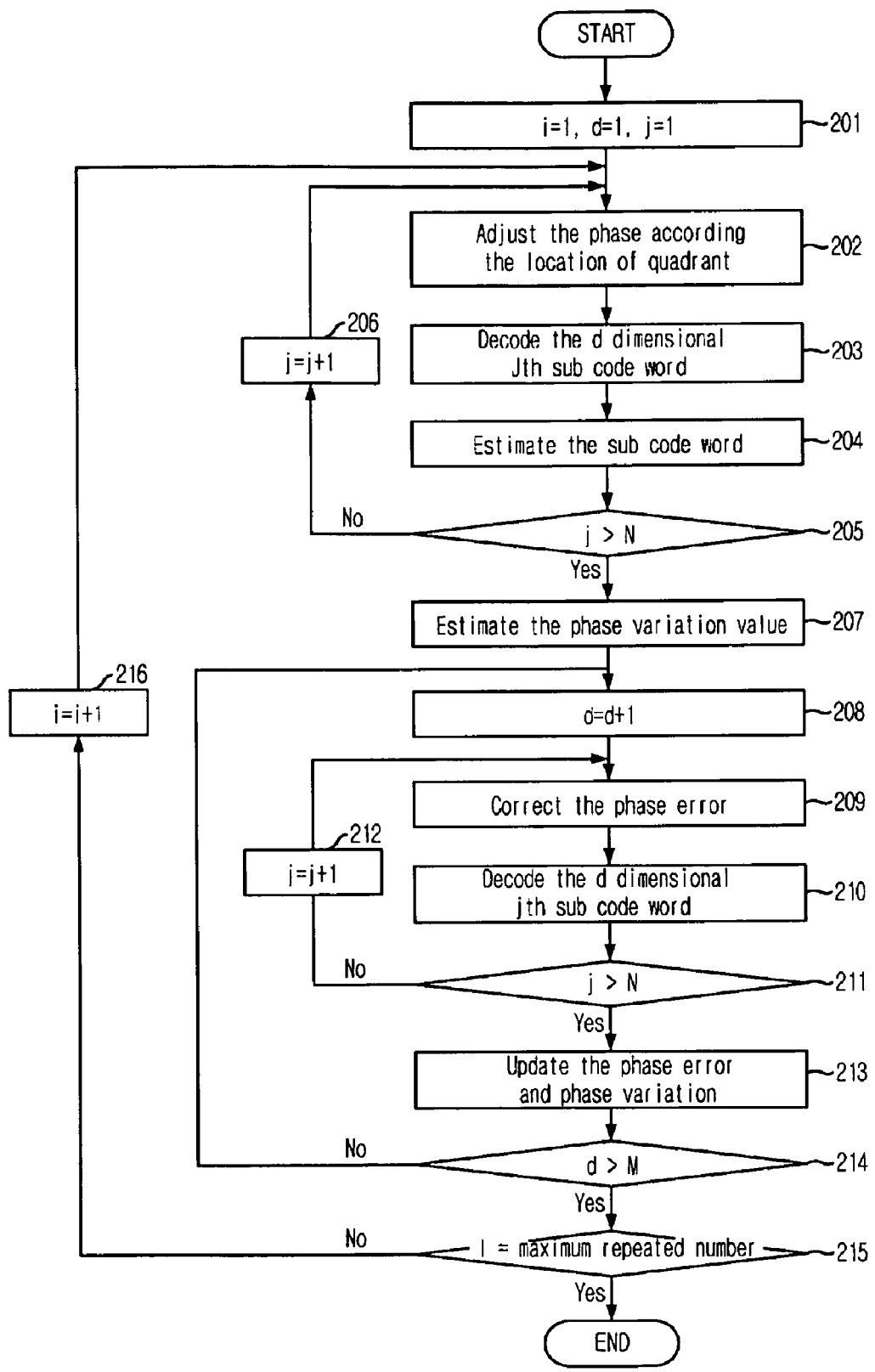

[Fig. 8]
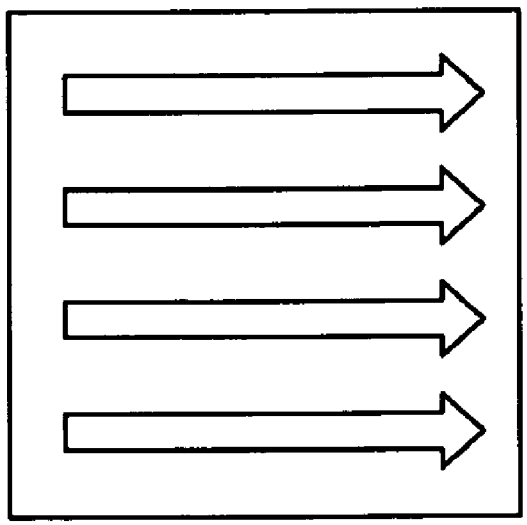
x axis direction
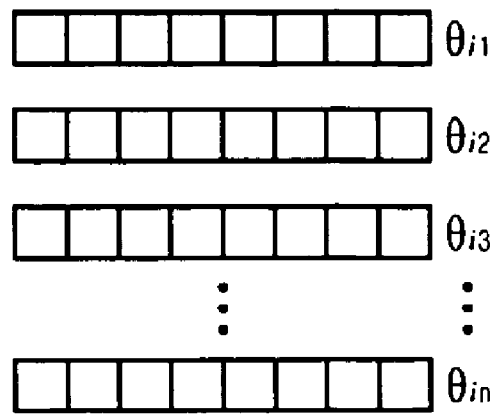
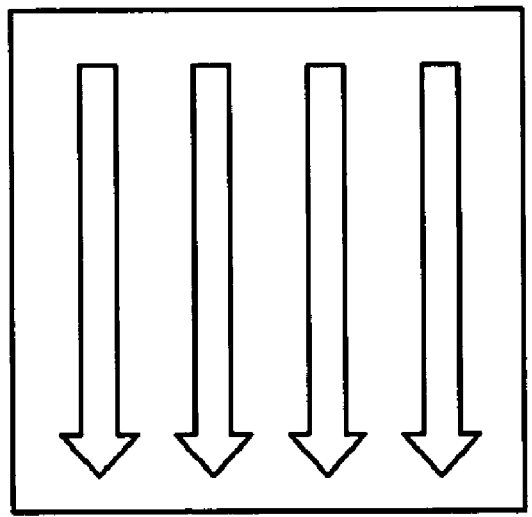
y axis diretion
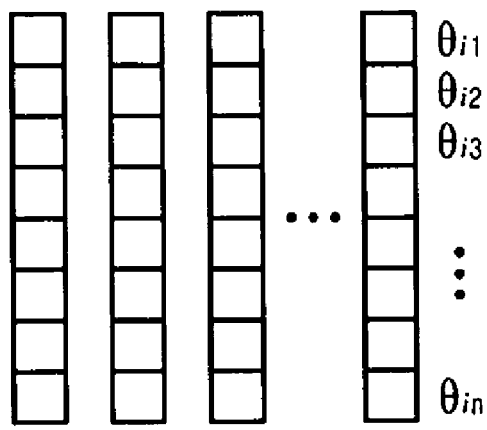

APPARATUS AND METHOD FOR PHASE RECOVERY USING INDEPENDENTLY DECODABLE COMPONENT CODES OF CHANNEL CODE IN WIRELESS COMMUNICATION SYSTEM

TECHNICAL FIELD

The present invention relates to an apparatus and a method for phase recovery using independently decodable component codes of channel code in a wireless communication system. More particularly, the present invention relates to an apparatus and a method for estimating and recovering phase errors in received signal by using information of soft decision decoding values calculated in a repeated turbo decoding process, under the circumstances with low receiving energy in the wireless communication system performing the repeated turbo decoding process employing a high dimension block turbo code.

BACKGROUND ART

Phase errors in a mobile communication channel of wireless communication system are caused by signals through multi paths due to neighboring buildings or geographical circumstances. In particular, the phase errors in a mobile communication channel changes by movements of a mobile object. Consequently, a received signal should be recovered by estimating the phase errors for securing a reliable communication because the received signal transmitted from a transmitter is deteriorated by the phase errors.

On the other hand, in the wireless mobile communication system, channel codes are employed in a conventional coding technique in order to obtain a required coding performance with a minimized energy and bandwidth.

Particularly, a turbo code, which is one of the channel codes, shows an outstanding bit error correction performance in a repeated decoding process employing input and output values of soft decision. However, there is a problem that such a performance of turbo code may be expected only in the case that a receiver acquires a correct signal without phase errors.

Therefore, recently, there are many studies on the improved performance of turbo code by detecting and recovering the changes of the phase errors occurred in the multi path channel.

U.S. Pat. No. 6,442,219 discloses a method of carrier phase estimation using maximum likelihood (ML) that is a phase recovery method having low complexity. However, the above mentioned prior art may not provide the performance gain by characteristics of codes because it does not consider the structure of channel codes.

Further, U.S. Pat. No. 5,937,016 discloses a method of temporarily determining symbols by recombining output bits with a status of memory according to decoding depth given by viterbi decoding unit based on convolutional codes, and discloses a phase recovery algorithm implemented in a soft input soft output (SISO) decoding unit controlled by turbo codes. However, since above mentioned prior art use only temporarily determined symbols without considering a structure of channel codes may not provide a desired total gain of the decoding algorithm.

Korean patent No. 0362851 discloses a method that estimates fading size and noise spreading of a channel using soft decision output values of a turbo code decoder. The soft decision output values get feedback an input of a repeated channel estimation unit to thereby update tap values of the estimation unit.

Many recent mobile applications require error correcting codes with a very long codeword to provide high quality multimedia services, which make it difficult for phase error, remain constant over such a long codeword. In addition, even after the phase compensation, received samples with residual phase rotation would reduce instantaneous SNR and this again decrease the decoding performance.

In order to solve this problem, we propose a piece-wise carrier recovery algorithm with a multi-dimensional block turbo code consisted of independently decodable component codes. Here we mean the component code as the consisting one dimensional block code. We estimate the phase reference at each component code, instead of estimating at the whole product code. By this way, we can correct time varying phase within a period of a component code length.

DISCLOSURE

Technical Problem

In view of the foregoing, it is an object of the present invention to provide an apparatus and method for phase recovery using independently decodable component codes in a wireless communication system, which is capable of efficiently estimating phase values of component codes and a carrier of a phase variation of total code by using structural characteristics of the block turbo code having component codes which can be independently decoded.

Technical Solution

In accordance with an aspect of the present invention, there is provided an apparatus for recovering a phase of received signal in wireless communication system using a channel code which contains independently decodable component codes, the method including the means of: decoding for decoding the input signal to thereby output the decoding value; estimation for estimating phase errors of the received signal by estimating phase errors of the each component codeword in the received signal to thereby generate phase error estimation values; and correction for correcting the phase of received signal using the phase error estimation values to thereby generate the phase corrected signal.

In accordance with another aspect of the present invention, there is provided a method for recovering a phase of received signal in wireless communication system using a channel code which contains independently decodable component codes, the method including the steps of: estimating phase errors of each component codeword received to thereby generate phase error estimation values of component codes; estimating phase variations between the component codeword using the phase error estimation values of component codes to thereby generate phase variation values; and correcting the phase of received signal using the phase error estimation values of component codes and the phase variation values; and decoding the signal of which phase was corrected.

Advantageous Effects

As described above, the present invention can estimate and recover phase information based on the reliability calculated by turbo decoding unit in the communication system performing repeated decoding using channel codes.

Additionally, the present invention can apply to the communication system efficiently recovering phase errors and decoding information bits at the repeated decoding unit by using component codes of proper block turbo codes and the setting the dimension according to the demands of a corresponded system without complex circuits or the transmission of additional training sequences.

Further, the present invention can efficiently recover phase errors from received data without a complex phase locked loop circuit or a long capture time in the wireless communication channel having phase errors because the present invention has an advantage that transmission is possible without preambles or the transmission of additional training sequences by estimating the each of phase of component codes which is capable of independently decoding using the reliability of soft decision calculated at turbo decoding unit and estimating the total phase error using the variation of the phase and recovering the phase thereby.

DESCRIPTION OF DRAWINGS

The above and other objects and features of the instant invention will become apparent from the following description of preferred embodiments taken in conjunction with the accompanying drawings, in which:

FIG. 1 is a simplified block diagram illustrating a wireless communication system employing a method of performing phase recovery process in accordance with the preferred embodiment of the present invention;

FIG. 2 is a graph showing relationship between phase error variation and the number of received component codeword in accordance with a preferred embodiment of the present invention;

FIGS. 3, 4, 5 and 6 are explanatory diagrams demonstrating phase error ranges;

FIG. 7 is a flow chart showing a method for phase error recovering process in accordance with the present invention; and FIG. 8 is a drawing showing relationship between phase errors of component code in a two dimensional block turbo codes in accordance with a preferred embodiment of the present invention.

BEST MODE FOR THE INVENTION

Hereinafter, the preferred embodiments of the present invention will be explained in detail with reference to the accompanying drawings.

FIG. 1 is a simplified block diagram illustrating a wireless communication system employing a method of performing phase recovery process in accordance with the preferred embodiment of the present invention.

As shown, the wireless communication system includes a transmission unit 110, a channel 120 and a receiving unit 130 for recovering phases of a received signal and decoding the received signal.

The transmission unit 110 includes a turbo coding unit 111 for turbo coding data having binary data and a symbol mapping unit 112 for mapping the coded data to symbols and transmitting the symbols through the channel 120 as a transmission signal.

In the channel 120, noises and phase errors are added to the transmission signal.

The receiving unit 130 includes a symbol inverse mapping unit 132, a turbo decoding unit 133, a phase estimating unit 134, a phase correcting unit 131 and a hard decision decoding unit 135.

The operations of the receiving unit 130 will be described hereinafter.

The phase correcting unit 131 receives the channel received signal, which is the transmission signal having the noises and phase errors added through the channel 120, and an output signal, i.e., a phase error estimation value, from the phase estimation unit 134, and corrects the phase error of the channel received signal using the phase error estimation value to thereby generate a phase corrected signal. If there is no output data from the phase estimation unit 134, the phase correcting unit 131 outputs the channel received signal as the phase corrected signal without the correcting process.

The symbol inverse mapping unit 132 receives the phase corrected signal from the phase correcting unit 131 and inversely maps the phase corrected signal to thereby output an inversely mapped signal.

The turbo decoding unit 133 receives the inversely mapped signal and performs a soft decision decoding process to thereby generate a soft decision decoding value.

The phase estimating unit 134 estimates the phase error of the received signal by using the soft decision decoding value to thereby generate the phase estimation value and outputs the phase estimation value to the phase correcting unit 131.

The above sequential procedures of turbo coding and recovering phase errors are performed repeatedly until a predetermined repetition number. If the predetermined repetition number exceeds a predetermined maximum number, the soft decision decoding values from the turbo decoding unit 133 are inputted into the hard decision decoding unit 130. And, the hard decision decoding unit 190 performs the hard decision decoding process through the use of the soft decision decoding values to thereby generate binary values as an output signal.

The channel code employed in the present embodiments is a block turbo code having component codes, wherein the component codes can be decoded independently and performed a parallel decoding process.

In the recent communication system, the channel codes having long frame are preferably employed since the longer the frame of channel code is, the greater the gain of coding is.

In accordance with the present invention, the turbo codes employing a hierarchical component code structure can improve the coding performance by increasing the length of total codes, and independent decoding is simultaneously possible by using the component codes. That is, the value of an estimated phase error can be updated through the repeated decoding procedures based on the difference between the values of phase errors of each block, which are calculated from the phase error estimation values of component codeword.

Hereinafter, the method of phase recovery using the method of estimating phase errors corresponding to each component codeword according to the present invention will be explained in detail.

As mentioned above, the conventional methods of phase estimation have a problem that the conventional method should perform the recovery procedures by setting a phase estimation value in one block as a constant value.

In contrast, the present invention divides the total block turbo code into a number of component codes which can be decoded independently in order to estimate the carrier and phase error using the phase error estimation values of each component codes. Therefore, in the case where phase errors change in a frame caused by the existence of a carrier, the recovery process of phase can be performed by using the phase recovery method of the present invention in an effective manner.

FIG. 2 is a graph showing relationship between the phase error variation and the number of received component codeword in accordance with a preferred embodiment of the present invention. As shown, the phase errors in the turbo code are increased continually according to an increase in the number of received component codeword.

In the case that the phase recovery is performed in the system by using block turbo codes, the each phase variation of component codeword is not greater than that of the total codeword and the phase can be recovered by estimating the phase error with each center phases ($\theta_{i1}, \theta_{i2}, \theta_{i3} \ldots, \theta_{in}$) as a reference.

The d dimensional block turbo code of containing component codes (k, n) which consist of information bits of k bits and coding bits of n bits shows an outstanding coding performance. Further, the block turbo code includes bits of $n^d$ and component codeword of the number of $n^{(d-1)}$. The component codeword can be decoded simultaneously and independently. That is, the result of decoding can be used when the decoding procedures of other dimensions are performed. Therefore, the phase error can be estimated and recovered by dividing the channel phase variation of the total frame into $n^{(d-1)}$ pieces.

FIGS. 3, 4, 5 and 6 demonstrate phase error ranges in accordance with a preferred embodiment of the present invention and show the examples of the phase error range to be estimated in the cases the center value $\theta_{estimate}$ of phase error 10 of component codeword is located in each quadrant.

FIG. 3 describes the case that phase error occurred in the first quadrant.

When the binary phase shift keying(BPSK) modulation is used, the sign, plus or minus sign, of the received signal of which phase error occurs in a first quadrant is not change but the absolute value of reliability thereof is decreased.

In the case where a phase error 10 is located on the fourth quadrant shown in FIG. 4, only the value of reliability projected onto a real axis is decreased but the sign, plus or minus sign, of the channel received signal is same as the code of original information.

In other words, the phase error 10 should occur in the range of the following equation so that the proper decoding process of codes can be performed.

$$-\frac{\pi}{2} \leq \theta_{estimate} \leq \frac{\pi}{2} \qquad \text{Eq. (1)}$$

However, as shown in FIG. 5, in the case where a phase error 10 is located in 2nd or 3rd quadrant, the sign of received signal is reversed, so that it may be differently decoded from the original signal. Although the case of 3rd quadrant is not shown, the case of 3rd quadrant is similar to that of 2nd case.

Accordingly, if the value of decoded reliability is under a threshold value, the received signal is reversed by rotating the phase 180 degree as described in FIGS. 3 and 4. That is, the phase is moved in the first or the third quadrant and then the phase error is estimated.

Referring to FIG. 6, a phase error 10 is changed through the first and second quadrant, so phase error is estimated after moving the phase of 90 degree referring to the phase range of the previous component codeword and the next component codeword.

Before the estimation of phase error, the signal (x) to be estimated is adjusted according to the range of phase error to thereby generate the adjusted signal (x') as follows.

$$x' = xe^{-j\delta} \qquad \text{Eq. (2)}$$

$$\delta = \begin{cases} 0 & \text{if } -\frac{\pi}{2} \leq \theta_{estimate} \leq \frac{\pi}{2} \\ \pi & \text{if } \frac{\pi}{2} \leq \theta_{estimate} \leq \frac{3\pi}{2} \\ \frac{\pi}{2} & \text{if } (d) \text{ case} \end{cases} \qquad \text{Eq. (3)}$$

FIG. 7 is a flow chart showing a method for phase error recovering process according to the present invention.

Firstly, the repeated number of decoding process (i), the dimension of block turbo code (d) and the sequence number of component codeword (j) are initialized by 1, at step 201.

Then, the quadrant location of the phase error of the received signal (x(m)) to be estimated phase error is determined and the phase of the received signal (x(m)) is adjusted by using the Eqs. (2) and (3) according to the location, at step 202.

Then, the corresponding component codeword, d dimensional $j_{th}$ component codeword, is decoded using the adjusted phase (x'(m)) as a result of Eq. (2), at step 203.

Then, as a repeated decoding process of the block turbo code arranged by the receiving order from the channel, the phase error($\theta_{ij}$), phase error of the component codeword of $j_{th}$ block in $i_{th}$ repeated decoding process, is estimated by using the following equation, at step 204.

$$\theta_{ij} = \arg\left\{\sum_{m=0}^{N-1} x'(m)\alpha^*(m)\right\} \qquad \text{Eq. (4)}$$

wherein, x' (m) is the received signal which is adjusted phase and N is the number of bits of component codeword and $\alpha(m)$ is the soft decision decoding value from the turbo decoding unit.

As shown in Eq. (4), the multiplication process of the received signal and the soft decision decoding value produces the phase as a result. And, the phase error which makes the maximum estimated phase information of one component codeword is estimated as a phase of the block.

Then, it is determined whether the phase estimating and decoding process for the component codeword (1=j=N) in one dimension is completed, at step 205.

If not completed, the sequence number of component codeword (j) is increased and the procedures from step 202 are repeated, at step 205.

If completed, the phase variation value $\Delta_i$ between the component codeword is estimated by using the sequence number and phase error estimation value of the component codeword, at step 207 as follows:

$$\Delta_i = f\{\theta_{ij}, j\} \qquad \text{Eq. (5)}$$

Wherein, many conventional estimation methods can be applied to the above function, f{}.

Then, the dimension of block turbo code (d) is increased, at step 208. From the next dimension of block turbo code, the phase error of received signal is corrected by the estimated phase error and phase variation at the previous dimension of block turbo code at step 209. And the corresponding component codeword is decoded, at step 210.

Then, the phase error correction process (step 209) and the decoding process (step 210) are repeated until the sequence of the component codeword (j) become the number of bits of component codeword (N), at steps 211 and 212. And, the phase error $\theta_{ij}$ and the phase variation $\Delta_i$ are updated thereby, at step 213.

Then, it is determined whether the processes for the all dimensional (1=d=M) block turbo codes are completed.

If not completed, the processes starting from step 208 are repeated.

If completed, it is determined whether the repeated number of decoding process (i) is same as the predetermined maximum repeated number.

If not the same, the repeated number of decoding process (i) is increased and the processes starting from 202 are repeated, at step 216, and if the same, all processes are finished.

FIG. 8 is a drawing showing relationship between phase errors of component code in a two dimensional block turbo codes in accordance with a preferred embodiment of the present invention.

As shown, after the first dimension of the first block turbo code, transmission bits are the result of interleaving, so neighboring bits in the block are not consecutive transmission bits. For example, at the first dimension of two dimensional block turbo codes, continuously received bits from the channel are received as neighboring bits of codeword.

However, the neighboring bits of codeword at the second dimension are individually located in different blocks at the previous decoding so each of them shows different aspects as shown in FIG. 8. That is the same at the block codes of high dimension beyond third dimension.

The method of the present invention can be embodied as a program and stored in a computer-readable recording medium, such as CD-ROM, RAM, ROM, floppy disks, hard disks, and optical disks.

While the present invention has been described with respect to certain preferred embodiments, it will be apparent to those skilled in the art that various changes and modifications may be made without departing from the scope of the invention as defined in the following claims.

What is claimed is:

1. A method for recovering a phase of a received signal in a wireless communication system using a channel code having a plurality of independently decodable component codewords, the method comprising the steps of:
   a) estimating phase errors of each of the plurality of component codewords received to thereby generate phase error estimation values of component codes;
   b) estimating phase variations between the phase errors of component codewords using the phase error estimation values of component codes to thereby generate phase variation values;
   c) correcting the phase of the received signal using the phase error estimation values of component codes and the phase variation values; and
   d) decoding the received signal having the corrected phase.

2. The method as recited in claim 1, further comprising the step of, e) reiterating the above steps from a) to d) until the decoding repeat number reaches a predetermined repeated decoding number with updating the phase error estimation values of component codes and the phase variation values.

3. The method as recited in claim 1, wherein the step a) includes the steps of:
   a-1) adjusting the phase of component codeword according to the quadrant location of phase to be estimated phase;
   a-2) performing the soft decision decoding process for the component codeword having the adjusted phase to thereby generate a soft decision decoding value; and
   a-3) calculating the phase error estimation value of component codeword using the soft decision decoding value and a phase adjusted component codeword.

4. The method as recited in claim 3, wherein the step a-1) includes the step of calculating the phase adjustment by using:

$$\delta = \begin{cases} 0 & \text{if } -\frac{\pi}{2} \leq \theta_{estimate} \leq \frac{\pi}{2} \\ \pi & \text{if } \frac{\pi}{2} \leq \theta_{estimate} \leq \frac{3\pi}{2} \\ \frac{\pi}{2} & \text{if } (d) \text{ case} \end{cases}$$

wherein $\theta_{estimate}$ is the phase of component codeword to be estimated and $\delta$ is the phase adjustment value.

5. The method as recited in claim 4, wherein, at the step a-1), the phase of component codeword is adjusted by using:

$$x' = xe^{-j\delta}$$

wherein x' is the phase adjusted component codeword and x is the component codeword to be adjusted.

6. The method as recited in claim 5, wherein, at the step a-3), the phase error estimation value is calculated by using:

$$\theta_{ij} = \arg\left\{\sum_{m=0}^{N-1} x'(m)\alpha^*(m)\right\}$$

wherein, x' (m) is the phase adjusted component codeword and $\alpha(m)$ is the soft decision decoding value and $\theta_{ij}$ is the phase error estimation value of component codeword.

7. The method as recited in claim 6, wherein, at the step b), the phase variation value is calculated by using the phase error estimation values of component codeword and the number of component codeword contained in the channel code.

8. An apparatus for recovering a phase of received signal in a wireless communication system using a channel code having a plurality of independently decodable component codewords, the method comprising:
   a decoding unit for decoding the input signal to thereby output the decoding value;
   an estimation unit for estimating phase errors of the received signal by estimating phase errors of each of the plurality of component codewords in the received signal to thereby generate phase error estimation values of component codewords and estimating phase variations between the phase errors of component codewords by using the phase error estimation values of component codewords to thereby generate phase variation values; and
   a correction unit for correcting the phase of received signal using the phase error estimation values of component codewords and the phase variation values to thereby generate the phase corrected signal.

9. The apparatus as recited in claim 8, wherein the decoding unit repeatedly performs decoding process for input signals from the correction unit and output the decoding values to the estimation unit until repeated decoding number reaches a predetermined maximum repeated decoding number to thereby update the phase error estimation values and the phase variation values.

10. The apparatus as recited in claim 9, wherein the estimation unit calculates the phase error estimation values by using:

$$\theta_{ij} = \arg\left\{\sum_{m=0}^{N-1} x'(m)\alpha^*(m)\right\}$$

wherein, x' (m) is the phase adjusted component codeword and $\alpha(m)$ is the soft decision decoding value and $\theta_{ij}$ is the phase error estimation value of component codeword.

* * * * *